United States Patent
Zheng et al.

(10) Patent No.: US 10,002,675 B2
(45) Date of Patent: Jun. 19, 2018

(54) SHIFT REGISTER UNIT, GATE DRIVING CIRCUIT AND DRIVING METHOD, AND DISPLAY APPARATUS

(71) Applicant: BOE TECHNOLOGY GROUP CO., LTD., Beijing (CN)

(72) Inventors: Haoliang Zheng, Beijing (CN); Seungwoo Han, Beijing (CN); Xing Yao, Beijing (CN); Hyunsic Choi, Beijing (CN); Guangliang Shang, Beijing (CN); Mingfu Han, Beijing (CN); Yunsik Im, Beijing (CN); Jungmok Jun, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 18 days.

(21) Appl. No.: 15/504,119

(22) PCT Filed: Aug. 12, 2016

(86) PCT No.: PCT/CN2016/094832
§ 371 (c)(1),
(2) Date: Feb. 15, 2017

(87) PCT Pub. No.: WO2017/133214
PCT Pub. Date: Aug. 10, 2017

(65) Prior Publication Data
US 2018/0108426 A1    Apr. 19, 2018

(30) Foreign Application Priority Data

Feb. 3, 2016    (CN) .......................... 2016 1 0076198

(51) Int. Cl.
*G09G 5/00*    (2006.01)
*G11C 19/28*    (2006.01)
(Continued)

(52) U.S. Cl.
CPC ........... *G11C 19/28* (2013.01); *G09G 3/3677* (2013.01); *G09G 3/3688* (2013.01);
(Continued)

(58) Field of Classification Search
CPC ... G11C 19/28; G11C 19/184; H01L 27/1251; H01L 27/124; H01L 27/1222; G09G 3/3688; G09G 3/3677
See application file for complete search history.

(56) References Cited

U.S. PATENT DOCUMENTS

2008/0258998 A1    10/2008  Miyake
2011/0273417 A1    11/2011  Shin et al.
(Continued)

FOREIGN PATENT DOCUMENTS

CN    101089939 A    12/2007
CN    101166023 A    4/2008
(Continued)

OTHER PUBLICATIONS

First Office Action in the Chinese Patent Application No. 201610076198.0, dated Sep. 28, 2017; English translation attached.
International Search Report & Written Opinion dated Nov. 16, 2016 regarding PCT/CN2016/094832.

*Primary Examiner* — Adam R Giesy
(74) *Attorney, Agent, or Firm* — Intellectual Valley Law, P.C.

(57) ABSTRACT

The present application discloses a method of driving a gate driving circuit in an operation cycle divided into a first sub-cycle and a second sub-cycle, including providing a gate driving circuit having a first plurality of shift register units with a second plurality of shift register units, the first plurality of shift register units being configured so that each odd/even numbered shift register unit includes a first bias-control terminal to receive a first/second bias signal CLK1/
(Continued)

CLK2, a second bias-control terminal to receive a second/first bias signal CLK2/CLK1, and a first control level terminal provided with a first control voltage VC1, the second plurality of shift register units being configured so that each odd/even numbered shift register unit includes a third bias-control terminal to receive a third/fourth bias signal CLK3/CLK4, a fourth bias-control terminal to receive a fourth/third bias signal CLK4/CLK3, and a second control level terminal provided with a second control voltage VC2; configuring the first bias signal CLK1 and the second bias signal CLK2 as first pair of clock signals at respective turn-on level and turn-off level with inverted phase in the first sub-cycle; setting the first control voltage VC1 to a turn-off level so that the first plurality of shift register units is controlled along with the first pair of clock signals to respectively output corresponding gate driving output signals in an output phase within the first sub-cycle; setting both the third bias signal CLK3 and the fourth bias signal CLK4 to a turn-off level and the second control voltage VC2 to turn-on level during the first sub-cycle; configuring the third bias signal CLK3 and the fourth bias signal CLK4 as second pair of clock signals at respective turn-on level and turn-off level with inverted phase in the second sub-cycle; setting the second control voltage VC2 to a turn-off level so that the second plurality of shift register units are controlled along with the second pair of clock signals to respectively output corresponding gate driving output signals in an output phase within the second sub-cycle; and setting the first bias signal CLK1 and the second bias signal CLK2 to a turn-off level and the second control voltage VC1 to a turn-on level during the second sub-cycle.

20 Claims, 10 Drawing Sheets

(51) Int. Cl.
    *G09G 3/36*     (2006.01)
    *G11C 19/18*     (2006.01)
    *H01L 27/12*     (2006.01)

(52) U.S. Cl.
    CPC .......... *G11C 19/184* (2013.01); *H01L 27/124* (2013.01); *H01L 27/1222* (2013.01); *H01L 27/1251* (2013.01)

(56) References Cited

U.S. PATENT DOCUMENTS

| | | | |
|---|---|---|---|
| 2012/0163528 A1* | 6/2012 | Jang | ............... G09G 3/3688 377/64 |
| 2014/0086379 A1 | 3/2014 | Ma et al. | |
| 2014/0168181 A1 | 6/2014 | Furuta et al. | |

FOREIGN PATENT DOCUMENTS

| | | |
|---|---|---|
| CN | 102237031 A | 11/2011 |
| CN | 102654986 A | 9/2012 |
| CN | 103559868 A | 2/2014 |
| CN | 105206243 A | 12/2015 |
| CN | 205564249 U | 9/2016 |
| KR | 20120056005 A | 6/2012 |

* cited by examiner

SHIFT REGISTER UNIT, GATE DRIVING CIRCUIT AND DRIVING METHOD, AND DISPLAY APPARATUS

CROSS-REFERENCE TO RELATED APPLICATION

This application is a national stage application under 35 U.S.C. § 371 of International Application No. PCT/CN2016/094832, filed Aug. 12, 2016, which claims priority to Chinese Patent Application No. 201610076198.0, filed Feb. 3, 2016, the contents of which are incorporated by reference in the entirety.

TECHNICAL FIELD

The present invention relates to a field of displaying, more particularly to a shift register unit, a gate drive circuit and driving method thereof, and a display apparatus.

BACKGROUND

Image display apparatuses include a driver for controlling image display in each of a plurality of pixels. The driver is a transistor-based circuit including a gate driving circuit and a data driving circuit. The gate driving circuit is primarily formed by cascading multiple units of shift register circuits. Each shift register unit outputs a gate driving signal to one of a plurality of gate lines of pixel transistors. The gate driving signals from the gate driving circuit scan through gate lines row by row, controlling each row of transistors to be in on/off states. In a gate driving circuit of a conventional Gate on Array (GOA), a number of transistors in each shift register unit of the gate driving circuit are prone to stress-induced shift of transistor threshold voltage under a forward bias condition for a long operation time. This shift of transistor threshold voltage, under the existing design of the shift register unit, becomes larger over time, affecting image display stability.

SUMMARY

In one aspect, the present invention provides a method of driving a gate driving circuit in an operation cycle divided into a first sub-cycle and a second sub-cycle, the method comprising providing a gate driving circuit having a first plurality of shift register units with a second plurality of shift register units, the first plurality of shift register units being configured so that each odd/even numbered shift register unit includes a first bias-control terminal to receive a first/second bias signal CLK1/CLK2, a second bias-control terminal to receive a second/first bias signal CLK2/CLK1, and a first control level terminal provided with a first control voltage VC1, the second plurality of shift register units being configured so that each odd/even numbered shift register unit includes a third bias-control terminal to receive a third/fourth bias signal CLK3/CLK4, a fourth bias-control terminal to receive a fourth/third bias signal CLK4/CLK3, and a second control level terminal provided with a second control voltage VC2; configuring the first bias signal CLK1 and the second bias signal CLK2 as first pair of clock signals at respective turn-on level and turn-off level with inverted phase in the first sub-cycle; setting the first control voltage VC1 to a turn-off level so that the first plurality of shift register units is controlled along with the first pair of clock signals to respectively output corresponding gate driving output signals in an output phase within the first sub-cycle; setting both the third bias signal CLK3 and the fourth bias signal CLK4 to a turn-off level and the second control voltage VC2 to turn-on level during the first sub-cycle; configuring the third bias signal CLK3 and the fourth bias signal CLK4 as second pair of clock signals at respective turn-on level and turn-off level with inverted phase in the second sub-cycle; setting the second control voltage VC2 to a turn-off level so that the second plurality of shift register units are controlled along with the second pair of clock signals to respectively output corresponding gate driving output signals in an output phase within the second sub-cycle; and setting the first bias signal CLK1 and the second bias signal CLK2 to a turn-off level and the second control voltage VC1 to a turn-on level during the second sub-cycle.

Optionally, the first plurality of shift register units comprises N shift register units cascaded in series front a first unit to Nth unit, N being a natural integer; the second plurality of shift register units comprises M shift register units cascaded in series from (N+1)th unit to (N+M)th unit, M being a natural integer; the Nth unit being cascaded in series with the (N+1)th unit; and M equals to N.

Optionally, the first sub-cycle and the second sub-cycle comprise two equal time periods, each of the first sub-cycle and the second sub-cycle comprises an input phase, an output phase, a reset phase, and a reset-maintaining phase, the second/first sub-cycle is a reverse-bias phase associated with the first/second sub-cycle.

Optionally, the method further comprises applying a third pair of clock signals with respective turn-on level and turn-off level at inverted phase to an output control terminal of respective odd and even numbered shift register units during both the first sub-cycle and the second sub-cycle.

Optionally, each shift register unit have a same circuit configuration as a (n)th unit, where n is a natural integer serial number of one of the first plurality of shift register units and the second plurality of shift register units, the (n)th unit comprising a first pull-up node control module having an input terminal and a reset terminal and being coupled to a pull-up node, the input terminal receiving a (n−1)th gate driving output signal from an adjacent (n−1)th unit for pulling up the pull-up node to a turn-on level during the input phase and bootstrapping the pull-up node above the turn-on level during the output phase, the reset terminal receiving a (n+1)th gate driving output signal from an adjacent (n+1)th unit for pulling down the pull-up node back to a turn-off level during the reset phase; an output module coupled to the pull-up node and having an output terminal for outputting (n)th gate driving output signal at a turn-on level based on bootstrapping the pull-up node above the turn-on level during the output phase; a first pull-down node control module coupled to the pull-up node and a pull-down node and receiving the (n−1)th gate driving output signal from the first input terminal for pulling down the pull-down node to a turn-on level during the input phase when the pull-up node is at a turn-on level; a second pull-up node control module coupled between the pull-up node and the pull-down node for pulling down the pull-up node to a turn-off level when the pull-down node is at a turn-on level; a pull-down module coupled between the pull-down node and the output terminal for controlling the (n)th gate driving output signal at a turn-on level during the reset phase by controlling the pull-down node to a turn-on level, and keeping the (n)th gate driving output signal at a turn-off level during a reset-maintaining phase; and a reverse-bias control module coupled to both the second pull-up node control module and the pull-down module.

Optionally, the reverse-bias control module comprises a first transistor having a source provided with a turn-off level, a drain coupled to the pull-down node, and a gate connected to the first/second control level terminal provided with the first/second control voltage VC1/VC2 if the reverse-bias control module belongs to one of the first/second plurality of shift register units.

Optionally, the second pull-up node control module comprises a second transistor having a gate connected to the pull-down node, a drain connected to the pull-up node, and a source connected to the first/second control level terminal provided with the first/second control voltage VC1/VC2 if the second pull-up node control module belongs to one of the first/second plurality of shift register units.

Optionally, the (n)th unit is an odd/even numbered shift register unit of the first plurality of shift register units, the pull-down module thereof comprises a third transistor having a drain connected to the pull-down node, a gate and a source commonly connected to the second/first bias-control terminal provided with the second/first bias signal CLK2/CLK1; and a fourth transistor having a gate connected to the first/second bias-control terminal provided with the first/second bias signal CLK1/CLK2, a drain connected to the pull-down node, and a source connected to the first control level terminal; and a fifth transistor having a gate connected to the pull-down node, a drain connected to the output terminal provided with the (n)th gate driving output signal, and a source connected to the first control level terminal provided with the first control voltage VC1.

Optionally, the (n)th unit is an odd/even numbered shift register unit of the second plurality of shift register units, the pull-down module thereof comprises a third transistor having a drain connected to the pull-down node, a gate and a source commonly connected to the fourth/third bias-control terminal provided with the fourth/third bias signal CLK4/CLK3; a fourth transistor having a gate connected to the third/fourth bias-control terminal provided with the third/fourth bias signal CLK3/CLK4, a drain connected to the pull-down node, and a source connected to the second control level terminal provided with the second control voltage VC2; and a fifth transistor having a gate connected to the pull-down node, a drain connected to the output terminal provided with the (n)th gate driving output signal, and a source connected to the second control level terminal provided with the second control voltage VC2.

Optionally, the method further comprises using an output control module in the (n)th unit of the first/second plurality of shift register units to control outputting the (n)th gate driving output signal at a turn-off level during the second/first sub-cycle, wherein the output control module comprises a sixth transistor having a gate provided with to a clock signal, a drain connected to the output terminal, and a source provided with a turn-off level.

Optionally, the first pull-up node-control module comprises a seventh transistor having a gate and a source commonly connected to the input terminal, and a drain connected to the pull-up node; an eighth transistor having a gate connected to the reset terminal, a drain connected to the pull-up node, and a source provided with a turn-off level; and a storage capacitor having a first terminal connected to the pull-up node and a second terminal connected to the output terminal.

Optionally, the (n)th unit is an odd/even numbered shift register unit of the first plurality of shift register units, the output module thereof comprises a ninth transistor having a gate connected to the pull-up node, a source connected to the first/second bias-control terminal provided with the first/second bias signal CLK1/CLK2, and a drain connected to the output terminal.

Optionally, the (n)th unit is an odd/even numbered shift register unit of the second plurality of shift register units, the output module thereof comprises a ninth transistor having a gate connected to the pull-up node, a source connected to the third/fourth bias-control terminal provided with the third/fourth bias signal CLK3/CLK4, and a drain connected to the output terminal.

Optionally, the first pull-down node-control module comprises a tenth transistor having a gate connected to the pull-up node, a drain connected to the pull-down node, and a source provided with a turn-off level; and an eleventh transistor having a gate controlled by the (n−1)th gate driving output signal from the adjacent (n−1)th unit, a drain connected to the pull-down node, and a source provided with a turn-off level.

Optionally, the method further comprises a starting module connected to a start terminal and the pull-down node, the start terminal being provided with a starting signal at a turn-on level for controlling the pull-down node at a turn-on level; a shift reset module connected to a shift reset terminal and the pull-up node, the shift reset terminal being provided with a shift reset signal at a turn-on level for controlling the pull-up node at a turn-off level; and an output pull-down module for controlling the output terminal with the (n)th gate driving output signal at a turn-off level when the (n+1)th gate driving output signal is provided with a turn-on level at the reset terminal.

Optionally, the starting module comprises a twelfth transistor having a gate and a source commonly provided with the starting signal and a drain connected to the pull-down node; the shift reset module comprises a thirteenth transistor having a gate controlled by the shift reset signal, a drain connected to the pull-up node, and a source provided with a turn-off level; and the output pull-down module comprises a fourteenth transistor having a gate connected to the reset terminal provided with the (n+1)th gate driving output signal, a drain connected to the output terminal for outputting the (n)th gate driving output signal, and a source provided with a turn-off level.

Optionally, the (n)th unit is a first unit of the first plurality of shift register units, the first pull-up node control module thereof comprises an input terminal to receive the starting signal for pulling up the pull-up node to a turn-on level during the input phase and bootstrapping the pull-up node above the turn-on level during the output phase.

Optionally, the (n)th unit is a last unit of the second plurality of shift register units, the first pull-up node control module thereof comprises a reset terminal to receive the shift reset signal for pulling down the pull-up node back to a turn-off level during the reset phase.

Optionally, the reverse-bias control module of each of the first/second plurality of shift register units is used to set a reverse bias blocking state to each transistor in the second pull-up node control module and pull-down module thereof during the second/first sub-cycle.

In another aspect, the present inventions provides a gate driving circuit comprising a first plurality of shift register units cascaded in series and a second plurality of shift register units cascaded in series, each of the second plurality of shift register units except a last shift register unit has an output terminal outputting a gate driving output signal which is used as an input signal at an input terminal of a next adjacent shift register unit, and each of the first plurality of shift register units except a first shift register has an output terminal outputting a gate driving output signal which is used as a reset signal at a reset terminal of a previous adjacent shift register unit.

Optionally, the first plurality of shift register units being configured so that each odd/even numbered shift register unit includes a first bias-control terminal to receive a first/second bias signal, a second bias-control terminal to receive a second/first bias signal, and a first control level terminal provided with a first control voltage, the second plurality of shift register units being configured so that each odd/even numbered shift register unit includes a third bias-control terminal to receive a third/fourth bias signal, a fourth bias-control terminal to receive a fourth/third bias signal, and a second control level terminal provided with a second control voltage level; and the first plurality of shift register units is configured to output respective gate driving output signals during a first sub-cycle while the second plurality of shift register units is partially configured to be in a reverse-bias state, and the first plurality of shift register units is partially configured to be in a reverse-bias state during a second sub-cycle while the second plurality of shift register units is configured t to output respective gate driving output signals, wherein the second sub-cycle sequentially follows the first sub-cycle plus to be one complete operation cycle.

Optionally, the first bias signal and the second bias signal are configured to be a first pair of complementary clock signals at respective turn-on and turn-off levels with inverted phase during the first sub-cycle and both at the turn-off level during the second sub-cycle, the first control voltage is set to a turn-off level during the first sub-cycle and to a turn-on level during the second sub-cycle; and the third bias signal and the fourth bias signal are configured to a turn-off level during the first sub-cycle and to be a second pair of complementary clock signals at respective turn-on/turn-off levels with inverted phase during the second sub-cycle, the second control voltage is set to a turn-on level during the first sub-cycle and a turn-off level during the second sub-cycle.

Optionally, the first plurality of shift register units comprises N numbers of shift register units, the second plurality of shift register units comprises M numbers of shift register units, N being equal to M and N+M being equal total numbers of shift register units.

Optionally, each of the N numbers of shift register units, except a first unit, comprises an input terminal receiving a gate driving output signal from a previous adjacent shift register unit, a reset terminal receiving another gate driving output signal from a next adjacent shift register unit, a start terminal receiving a starting signal, and a shift-reset terminal receiving a shift reset signal, the first unit has an input terminal receiving the starting signal; each of the M numbers of shift register units, except a last unit, comprises an input terminal receiving a gate driving output signal from a previous adjacent shift register unit, a reset terminal receiving another gate driving output signal from a next adjacent shift register unit, a start terminal receiving a starting signal, and a shift-reset terminal receiving a shift reset signal, the last unit has a reset terminal receiving the shift-reset signal; and the first sub-cycle comprises a first period of time, the second sub-cycle comprises a second period of time, the first period of time being equal to the second period of time.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
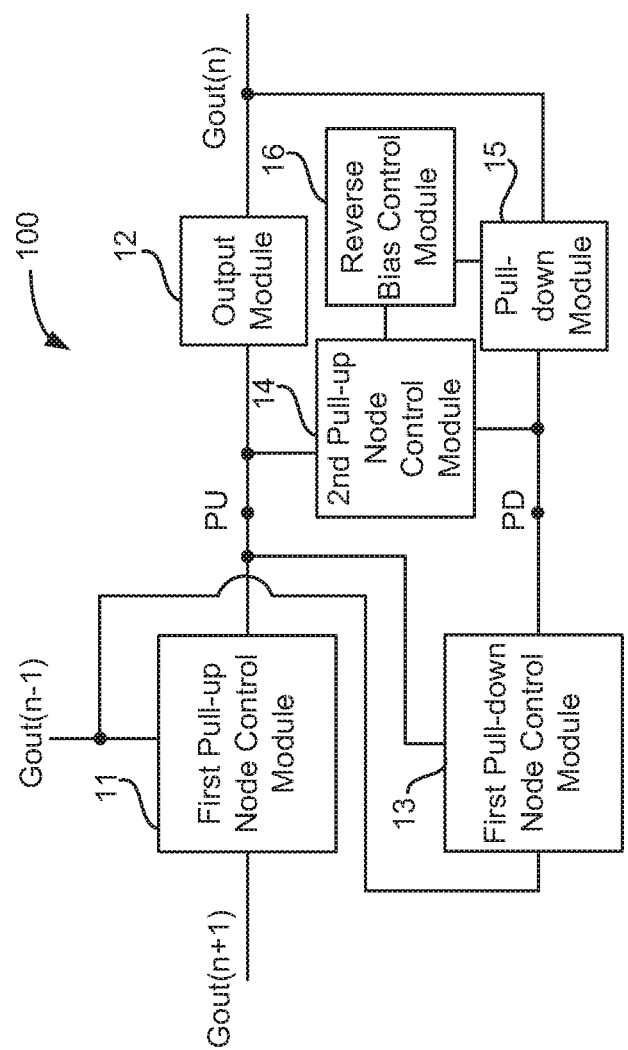
FIG. 1 is a simplified diagram of a shift register unit in some embodiments.

FIG. 1 is a simplified diagram of a shift register unit in some embodiments. Referring to FIG. 1, the shift register 100 is just one unit, i.e., an (n)th unit, of a plurality of shift registers that are cascaded in series to form a gate driving circuit for controlling image display in a plurality of operation cycles of a flat panel display apparatus. Here n is an integer identifying a random-selected current unit in the cascaded series of the plurality of shift registers. An adjacent unit before the current unit is (n−1)th unit and another adjacent unit after the current unit is (n+1)th unit. Each unit is configured to output a gate driving output signal Gout. Each operation cycle includes sequentially an input phase, an output phase, a reset phase, a reset-maintaining phase, and a reverse-bias phase. As shown, the shift register 100 includes at least a first pull-up node control module 11, an output module 12 with an output terminal for outputting a gate driving output signal Gout(n) for the present shift register unit, a first pull-down node control module 13, a pull-up node PU connected between the first pull-up node control module 11 and the output module 12, a pull-down node PD connected between the first pull-down node control module 13 and a pull-down module 15 which is further connected to the output terminal.

The first pull-up node control module 11 has a first input terminal configured to receive a gate driving output signal Gout(n−1) from an adjacent shift register, the (n−1)th unit, located before the current (n)th unit during the input phase of each operation cycle. In some embodiments, the first pull-up node control module 11 is configured to use the (n−1)th-unit gate driving output signal Gout(n−1) to control pulling-up of a potential level of the pull-up node PU. In some embodiments, the first pull-up node control module 11 is configured to bootstrap the pull-up node for further pulling up its potential level during the output phase of each operation cycle. In some embodiments, the first pull-up node control module 11 has a first reset terminal configured to receive another gate driving output signal Gout(n+1) from another adjacent shift register, the (n+1)th unit, located after the current n-th unit during the reset phase of each operation cycle. The first pull-up node control module 11 is configured to use the (n+1)th-unit gate driving output signal Gout(n+1) to control pulling-down the potential level of the pull-up node PU.

The output module 12, connected to the pull-up node PU, is configured to use the potential level at the pull-up node PU to control outputting the (n)th-unit gate driving output signal Gout(n) with a high voltage level to the output terminal. In general, the high voltage level represents a control voltage applied to a gate of a thin-film transistor within the shift register unit to turn on the transistor and thereby is simply called a turn-on level in this disclosure. Similarly, a low voltage level corresponds to a control gate voltage to turn off the thin-film transistor and is simply called a turn-off level in this disclosure. Specific value of the high or low voltage levels may vary as the changes of the thin-film transistor and other circuit design features including system power supply voltage levels, for example, a change from a n-type transistor (used in current disclosure) to p-type transistor.

The first pull-down node control module 13 has a second input terminal and a third input terminal. The second input terminal is directly connected to the first input terminal for receiving the (n−1)th-unit gate driving output signal Gout(n−1). The third input terminal is connected to the pull-up node PU. In some embodiments, the first pull-down node control module is configured to control keeping the pull-down node PD at a turn-off level when the pull-up node PU is at a turn-on level. In some embodiments, the first pull-down node control module is configured to use the (n−1)th-unit gate driving output signal Gout(n−1) to pull down the potential level of the pull-down node PD during the input phase of each operation cycle.

Referring to FIG. 1 again, the shift register 100 further includes a second pull-up node control module 14 coupled between the pull-up node PU and the pull-down node PD and a reverse-bias control module 16 coupled between the second pull-up node control module 14 and the pull-down module 15. In some embodiments, the second pull-up node control module 14 is configured to pull down the potential level at the pull-up node PU when the pull-down node PD is at a turn-on level. In some embodiments, the pull-down module 15 is configured to control the (n)th-unit gate driving output signal Gout(n) to be a turn-off level by controlling the potential level of the pull-down node PD to the turn-on level during the reset phase of each operation cycle. Further, the pull-down module 15 is configured to control the (n)th-unit gate driving output signal Gout(n) to remain at the turn-off level by controlling the potential level of the pull-down node PD during the reset-maintaining phase of each operation cycle.

The reverse-bias control module 16 is configured to control all transistors within the second pull-up node control module 14 to be in a reverse bias condition and control all transistors within the pull-down module 15 to be in a reverse bias condition during the reverse-bias phase of each operation cycle. Provided that all the transistors are n-type transistors, the reverse bias condition corresponds to a gate voltage being set to be lower than a source voltage for each transistor used in the second pull-up node control module 14 and the pull-down module 15.

The second pull-up node control module 14 and the pull-down module 15 in the shift register 100 are the components of the shift register used with the longest working time during its operation as a unit of a gate driving circuit for controlling image display. Thus the transistors therein are subjected to the most severe impact of stress due to prolonged one-directional biasing between the gate and the source to cause a shift of transistor threshold voltage level that is increasing as the working hours of these transistors increase. Some embodiments of the present invention, as illustrated by an exemplary diagram of the shift register 100 in FIG. 1, utilize a reverse bias control module 16 to set a reverse bias condition for all the transistors that are mostly impacted by the operation stress during a reverse bias phase added into each operation cycle. By introducing reversed biasing condition to the transistors regularly from time to time in each operation cycle, particularly those included in the second pull-up node control module 14 and the pull-down module 15, the shift of threshold voltage level of each corresponding transistor can be suppressed or reduced so that the reliability of these transistors as well as the whole shift register and the gate driving circuit can be enhanced.

Figure 2:
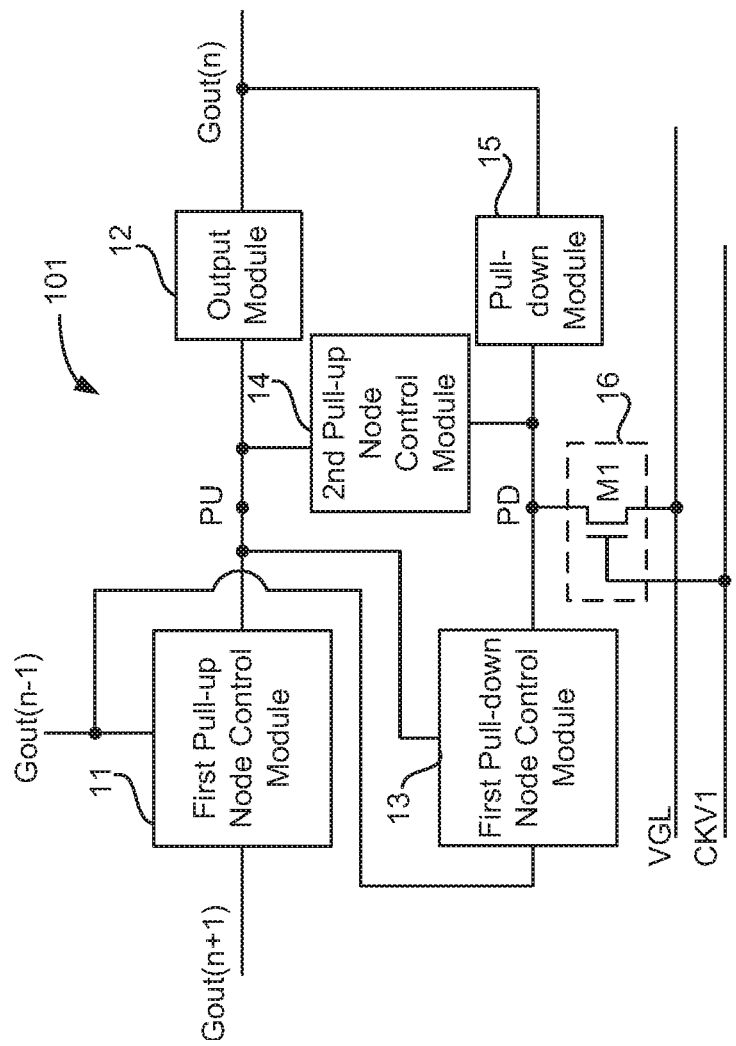
FIG. 2 is a simplified diagram of a shift register unit in some embodiments.

FIG. 2 is a simplified diagram of a shift register unit in some embodiments. Referring to FIG. 2, the shift register 101 is substantially similar to the shift register 100 of FIG. 1 and further includes a control level terminal CKV1. In some embodiments, the reverse bias control module 16 includes a first transistor M1. A gate of the first transistor M1 is connected to the control level terminal CKV1. A first terminal of M1 is connected to the pull-down node PD. A second terminal of M1 is connected to a power supply (not shown) provided with a turn-off level VGL. In an embodiment, M1 is an n-type transistor.

Figure 3:
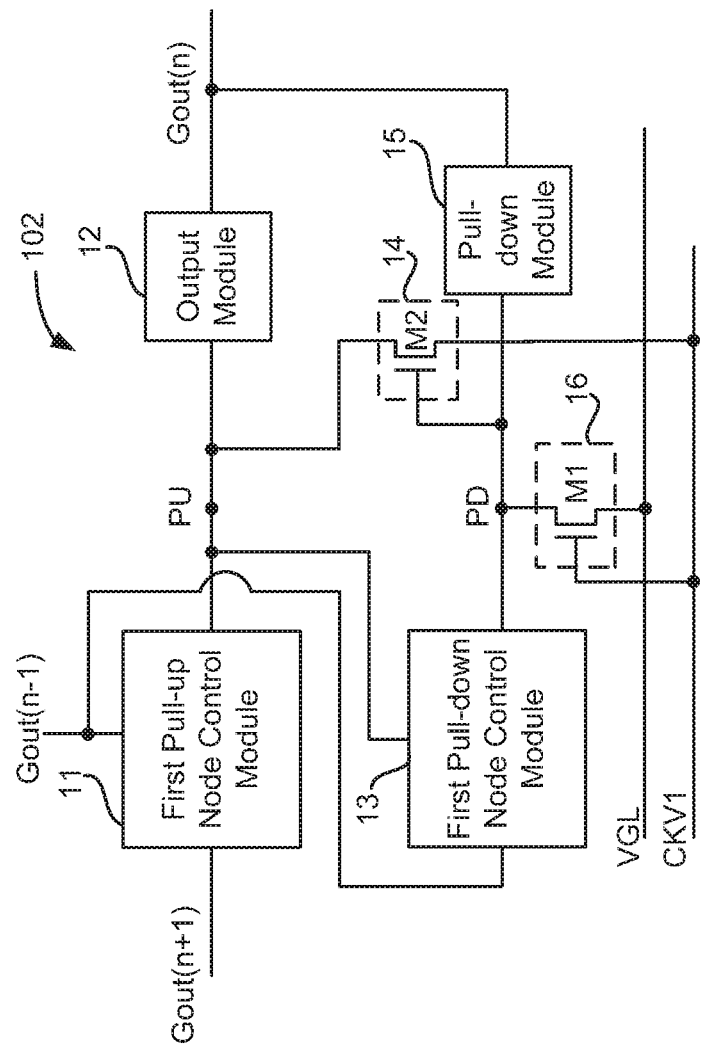
FIG. 3 is a simplified diagram of a shift register u in some embodiments.

FIG. 3 is a simplified diagram of a shift register unit in some embodiments. Referring to FIG. 3, the shift register 102 is substantially similar to the shift register 101 of FIG. 2. In some embodiments, the second pull-up node control module 14 in the shift register 102 includes a second transistor M2. A gate of the second transistor M2 is connected to the pull-down node PD. A first terminal of M2 is connected to the pull-up node PU. A second terminal of M2 is connected to the control level terminal CKV1. In an embodiment, M2 is an n-type transistor.

Figure 4:
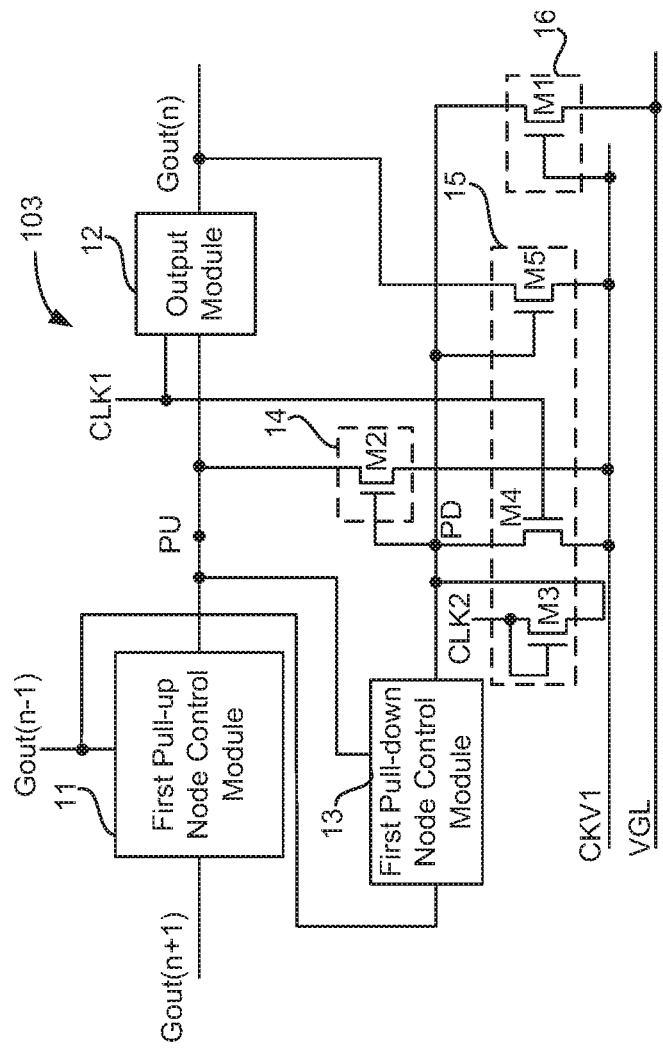
FIG. 4 is a simplified diagram of a shift register u in some embodiments.

FIG. 4 is a simplified diagram of a shift register unit in some embodiments. Referring to FIG. 4, the shift register 103 is substantially similar to the shift register 102 of FIG. 3 and further includes a first bias-control terminal CLK1 and a second bias-control terminal CLK2. In some embodiments, the pull-down module 15 in the shift register 103 includes a third transistor M3, a fourth transistor M4, and a fifth transistor M5. A gate of the third transistor M3 and a first terminal of M3 are commonly connected to the second bias-control terminal CLK2. A second terminal of M3 is connected to the pull-down node PD. A gate of the fourth transistor M4 is connected to the first bias-control terminal CLK1. A first terminal of M4 is connected to the pull-down node PD. A second terminal of M4 is connected to the control level terminal CKV1. A gate of the fifth transistor M5 is connected to the pull-down node PD. A first terminal of M5 is connected to the output terminal associated with the (n)th-unit gate driving output signal Gout(n). A second terminal of M5 is connected to the control level terminal CKV1. In an embodiment, M1, M2, M3, M4, and M5 are all n-type transistors.

Figure 5:
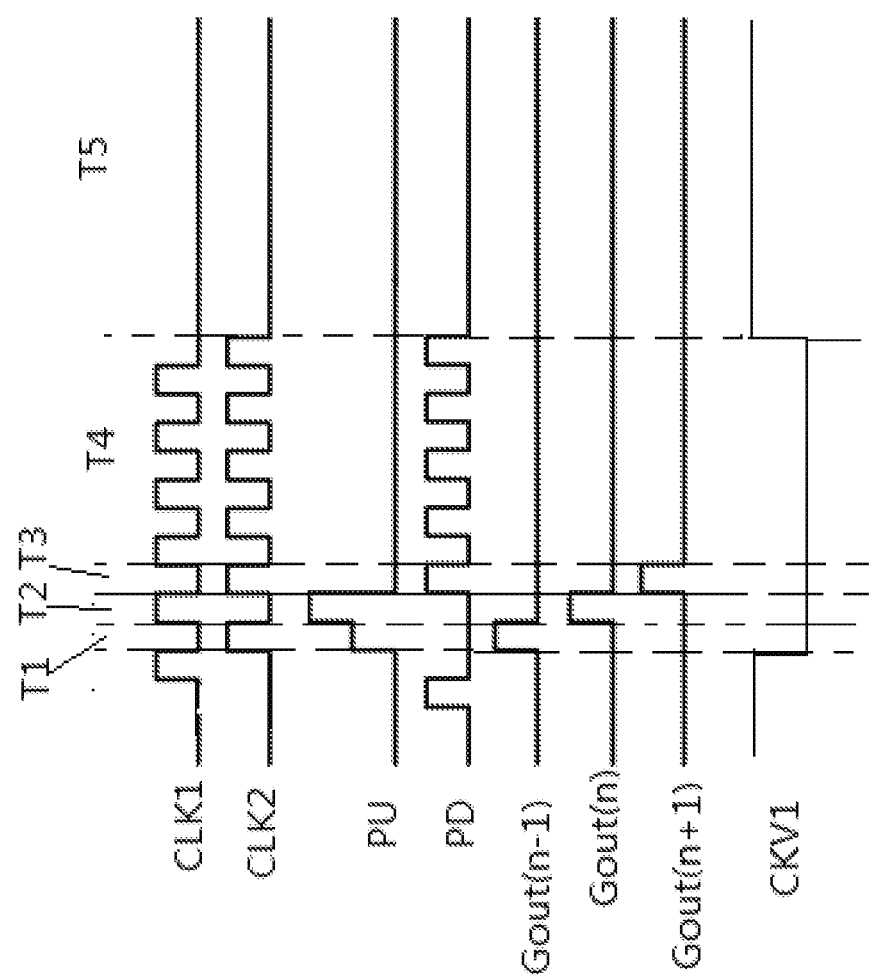
FIG. 5 is a diagram illustrating an operation cycle with several working phases for the shift register unit of FIG. 4 in some embodiments.

In an implementation, each shift register, as illustrated in examples of FIGS. 1-4, is driven to operate in a plurality of operation cycles as a unit in a gate driving circuit for controlling image display. Each operation cycle is a basic time period for displaying an image that is driven by one set of gate driving control signals. FIG. 5 is a diagram illustrating an operation cycle with several working phases for the shift register unit of FIG. 4 in some embodiments. Referring to the FIG. 5, the operation cycle includes sequentially an input phase T1, an output phase T2, a reset phase T3, a reset-maintaining phase T4, and a reverse-bias phase T5. In some embodiments, in the input phase T1, the output phase T2, the reset phase T3, and the reset-maintaining phase T4, the control level terminal CKV1 in the shift register 103 is set to a turn-off level. In addition, the first bias-control terminal CLK1 is provided with a first clock signal and the second bias-control terminal CLK2 is provided with a second clock signal. The second clock signal is inverted in phase complementary to the first clock signal during the above part of operation cycles in the input phase T1, the output phase T2, the reset phase T3, and the reset-maintaining phase T4. Under these setups, the shift register 103 is operated in a normal biasing condition for outputting a gate driving output signal.

In some embodiments, in the reverse-bias phase T5, the control level terminal CKV1 is provided with a turn-on level, and the first bias-control terminal CLK1 and the second bias-control terminal CLK2 are provided with a turn-off level. These setups allow all transistors in the second pull-up node control module 14 and the pull-down module 15 in the shift register 103 to be set to a reverse blocking state.

Specifically, using the shift register 103 of FIG. 4 as an example, a detailed description on the reverse-bias phase operation is shown below. Referring to both FIG. 4 and FIG. 5, in the reverse-bias phase T5, the control level terminal CKV1 is provided with a turn-on level. Then, the first transistor M1 is turned on. The turn-off level VGL is passed to the pull-down node PD. In addition, the first bias-control terminal CLK1 and the second bias-control terminal CLK2 are provided with the turn-off level. As the gate of M2 is at the turn-off level VGL, the second terminal, a source, of M2 is connected to the CKV1 at the turn-on level. Thus M2 is in a reverse block state. The gate of M3 is at the turn-off level provided by CLK2. The second terminal, a source, of M3 is connected to the pull-down node PD at the turn-off level VGL. Thus, it is required to set the second bias-control terminal with a low level below the VGL level to make the third transistor M3 at the reverse blocking state. The gate of the fourth transistor M4 is set to the turn-off level by CLK1. The second terminal, a source, of M4 is at the turn-on level provided by the control level terminal CKV1. Thus, M4 is set to a reverse blocking state. The gate of the fifth transistor M5 is connected to the pull-down node PD at the turn-off level VGL. The second terminal, a source, of M5 is at a turn-on level provided by the control level terminal CKV1. So, the fifth transistor M5 is also set to a reverse blocking state.

In some embodiments, the shift register further includes an output control module configured to control the output terminal for outputting the gate driving output signal at a turn-off level during the reverse-bias phase of each operation cycle.

In some embodiments, the control output module includes a sixth transistor. The sixth transistor has a gate connected to an input terminal provided with a clock signal. The transistor has a first terminal or drain connected to the output terminal of the shift register unit named as the current (n)th unit of the gate driving circuit. The transistor has a second terminal or source connected to a port provided with a turn-off level. The detailed structural description and functional illustration of this output control module can be found in some specific embodiments and figures of the present disclosure shown below.

In some embodiments, for the shift register shown in each of FIG. 1 through FIG. 4, the first pull-up node control module 14 includes a seventh transistor, an eighth transistor, and a storage capacitor. In some embodiments, the seventh transistor has a gate and a first terminal commonly connected to the first input terminal of the first pull-up node control module 14. The transistor also has a second terminal connected to the pull-up node PU. The eighth transistor has its gate connected to the first reset terminal of the first pull-up node control module 14. The eighth transistor also has a first terminal connected to the pull-up node PU and a second terminal connected to a power supply provided with a turn-off level. The storage capacitor has a first terminal connected to the pull-up node PU and a second terminal connected to the output terminal of the output module 12 associated with the (n)th-unit gate driving output signal Gout(n). The detailed structural description and functional illustration of this first pull-up node control module can be found in some specific embodiments and figures of the present disclosure shown below.

In some embodiments, for the shift register shown in each of FIG. 1 through FIG. 4, the output module 12 includes a ninth transistor. The ninth transistor has a gate connected to the pull-up node PU. This transistor also has a first terminal connected to the first bias-control terminal and a second terminal connected to the output terminal associated with the (n)th-unit gate driving output signal Gout(n). The detailed structural description and functional illustration of this output module can be found in some specific embodiments and figures of the present disclosure shown below.

In some embodiments, for the shift register shown in each of FIG. 1 through FIG. 4, the pull-down module 15 includes a tenth transistor and an eleventh transistor. In some embodiments, the tenth transistor has a gate connected to the pull-up node PU, a first terminal connected to the pull-down node PD, and a second terminal provided with a turn-off level such as VGL. The eleventh transistor has a gate connected to the second input terminal which connects to the first input terminal for receiving the (n−1)th-unit gate driving output signal. The eleventh transistor also has a first terminal connected to the pull-down node PD and a second terminal provided with the turn-off level such as VGL. The detailed structural description and functional illustration of this pull-down module can be found in some specific embodiments and figures of the present disclosure shown below.

In some embodiments, the shift register shown in each of FIG. 1 through FIG. 4 further includes a starting module, a shift reset module, and an output pull-down module. In some embodiments, the starting module is coupled between a start terminal and the pull-down node PD and is configured to control the pull-down node PD to a turn-on level when a start signal is inputted from the start terminal as a turn-on level. In some embodiments, the shift reset module is coupled between a shift reset terminal and the pull-up node PU and is configured to control the pull-up node PU to a turn-off level when a shift reset signal is inputted from the shift reset terminal as a turn-on level. In some embodiments, the output pull-down module is configured to control the gate driving output signal outputted at the output terminal of the current shift register, the (n)th unit, at the turn-off level when the first reset terminal receives a next gate driving output signal from the adjacent (n+1)th unit at the turn-on level.

In some embodiments, the starting module includes a twelfth transistor having a gate and a first terminal commonly connected to the start terminal to receive a start signal and a second terminal connected to the pull-up node PU.

In some embodiments, the shift reset module includes a thirteenth transistor having a gate connected to the shift reset terminal, a first terminal connected to the pull-up node PU, and a second terminal provided with the turn-off level from a power supply.

In some embodiments, the output pull-down module includes a fourteenth transistor having a gate connected to the first reset terminal, a first terminal connected to the output terminal of current shift register associated with a (n)th-unit gate driving output signal, and a second terminal provided with a turn-off level. The detailed structural description and functional illustration of the starting module, the shift reset module and the output pull-down module can be found in some specific embodiments and figures of the present disclosure shown below.

Figure 6:
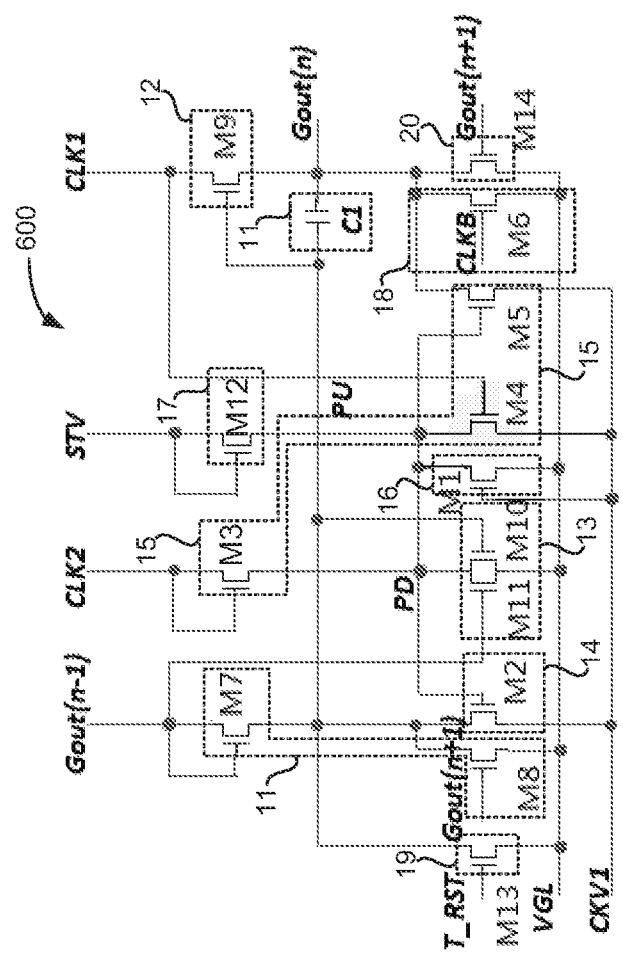
FIG. 6 is a circuit diagram of a shift register unit in some embodiments.

FIG. 6 is a circuit diagram of a shift register unit according to a specific embodiment of the present invention. Referring to FIG. 6, in a specific embodiment, the shift register 600 includes a first pull-up node control module 11, a pull-up node PU coupled to the first pull-up node control module 11, an output module 12 coupled between the pull-up node PU and an output terminal, a first pull-down node control module 13, a pull-down node PD coupled to the first pull-down node control module 13, a second pull-up node control module 14 coupled between the pull-up node PU and the pull-down node PD, a pull-down module 15 coupled between the pull-down node PD and the output terminal, a reverse-bias control module 16 coupled between the second pull-up node control module 14 and the pull-down module 15, a control level terminal CKV1, a first bias-control terminal CLK1, a second bias-control terminal CLK2, a starting module 17, an output control module 18, a shift reset module 19, and an output pull-down module 20.

In particular, the reverse bias control module 16 includes a first transistor M1. M1 has a gate connected to the control level terminal CKV1, a drain connected to the pull-down node PD, and a source provided with a turn-off level VGL.

Referring to FIG. 6, the second pull-up node control module 14 includes a second transistor M2. M2 has a gate connected to the pull-down node PD, a drain connected to the pull-up node PU, and a source connected to the control level terminal CKV1.

Referring to FIG. 6, the pull-down module 15 includes a third transistor M3, a fourth transistor M4, and a fifth transistor M5. M3 has a gate and a drain commonly connected to the second bias-control terminal CLK2, and a source connected to the pull-down node PD. M4 has a gate connected to the first bias-control terminal CLK1, a drain connected to the pull-down node PD, and a source connected to the control level terminal CKV1. M3 has a gate connected to the pull-down node PD, a drain connected to the output terminal outputting a gate driving output signal Gout(n) of the current (n)th shift register, and a source connected to the control level terminal CKV1.

Referring to FIG. 6, the output control module 18 includes a sixth transistor M6. M6 has a gate connected to a clock signal input terminal provided with a clock signal CLKB, a drain connected to the output terminal associated with the gate driving output signal Gout(n), and a source provided with the turn-off level VGL.

Referring to FIG. 6, the first pull-up node control module 11 includes a seventh transistor M7, an eighth transistor M8, and a storage capacitor C1. M7 has a gate and a drain commonly connected to an input terminal of the current (n)th shift register receiving a gate driving output signal Gout(n−1) from a last adjacent (n−1)th shift register. M7 has a source connected to the pull-up node PU. M8 has a gate connected to a reset terminal of the current (n)th shift register receiving another gate driving output signal Gout(n+1) from a next adjacent (n+1)th shift register. M8 has a drain connected to the pull-up node PU and a source provided with the turn-off level VGL. C1 has a first terminal connected to the pull-up node PU and a second terminal connected to the output terminal with the gate driving output signal Gout(n).

Referring to FIG. 6, the output module 12 includes a ninth transistor M9. M9 has a gate connected to the pull-up node PU, a drain connected to the first bias-control terminal CLK1, and a source connected to the output terminal with the gate driving output signal Gout(n).

Referring to FIG. 6, the first pull-down node control module 13 includes a tenth transistor M10 and an eleventh transistor M11. M10 has a gate connected to the pull-up node PU, a drain connected to the pull-down node PD, and a source provided with the turn-off level VGL. M11 has a gate connected to the first input terminal, a drain connected to the pull-down node PD, and a source provided with the turn-off level VGL.

Referring to FIG. 6, the starting module 17 includes a twelfth transistor M12 having a gate and a drain connected commonly to a start terminal with a start signal STV and a source connected the pull-up node PU.

Referring to FIG. 6, the shift reset module 19 includes a thirteenth transistor M13, M13 has a gate connected to the shift reset terminal T_RST, a drain connected to the pull-up node PU, and a source provided with the turn-off level VGL.

Referring to FIG. 6, the output pull-down module 20 includes a fourteenth transistor M14. M14 has a gate connected to the reset terminal, a drain connected to the output terminal with the gate driving output signal Gout(n), and a source provided with the turn-off level VGL.

Referring to FIG. 6, all the transistors in the shift register 600 are n-type transistor. In some embodiments, the shift register 600 is substantially the same as the shift register 100. In some embodiments, the shift register 600 is substantially the same as the shift register 101. In some embodiments, the shift register 600 is substantially the same as the shift register 102. In some embodiments, the shift register 600 is substantially the same as the shift register 103.

Figure 7:
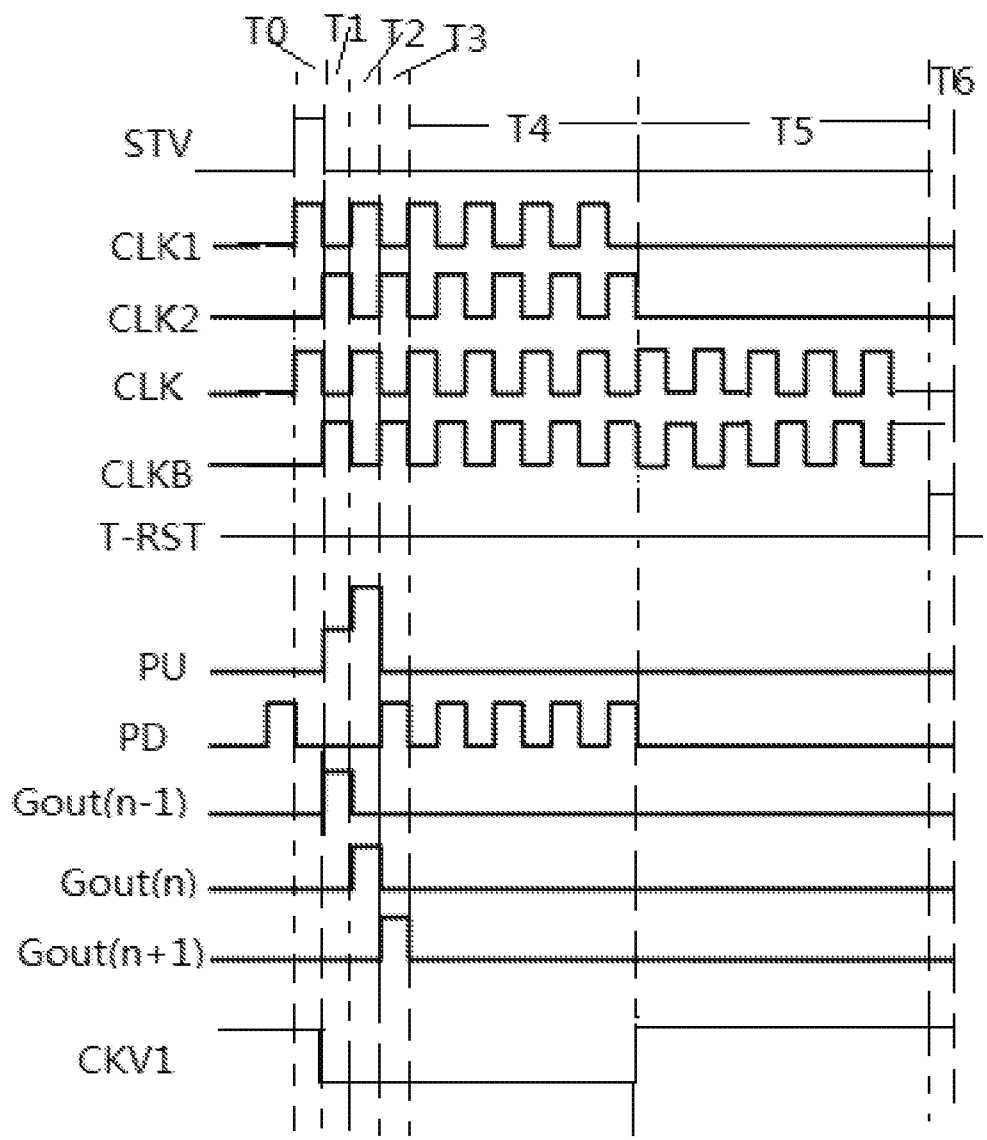
FIG. 7 is an operation timing diagram for the shift register unit of FIG. 6 in some embodiments.

FIG. 7 is an operation timing diagram for the shift register unit of FIG. 6 in some embodiments. Referring to FIG. 7, an operation cycle including a plurality sequential phases of applying multiple control signals for driving the shift register of FIG. 6. Each operation cycle includes, sequentially, a start phase T0, an input phase T1, an output phase T2, a reset phase T3, a reset-maintaining phase T4, a reverse-bias phase T5, and an end phase T6.

Referring both FIG. 6 and FIG. 7, in the start phase T0, the start signal STV is set to a turn-on level. The twelfth transistor M12 is in conduction state, making the pull-down node PD also at a turn-on level. In the next input phase T1, STV is set to a turn-off level. The gate driving output signal Gout(n−1) from the last adjacent (n−1)th shift register is provided as turn-on level to turn M7 and M11 on, pulling up the potential level at the pull-up node PU and pulling down the potential level at the pull-down node PD. The second bias-control terminal is also provided as a turn-on level. But, the gate driving output signal Gout(n+1) from the next adjacent (n+1)th shift register and the first bias-control terminal are provided with a turn-off level. M9 is turned on to allow the Gout(n) signal at a turn-off level outputted at the output terminal.

In the output phase T2, the start signal STV is set to the turn-off level. Both the (n–1)th-unit gate driving output signal Gout(n–1) received at the input terminal and the (n+1)th-unit gate driving output signal Gout(n+1) received at the reset terminal are turn-off level. The first bias-control terminal is provided with a turn-on level while the second bias-control terminal is provided with a turn-off level. The potential level at the pull-up node PU is pulled up by a bootstrapping effect from the storage capacitor C1. But the pull-down node PD is kept at the turn-off level. In this phase, M9 is in conduction state so that the turn-on level provided at the first bias control terminal is passed to the output terminal for outputting the (n)th-unit gate driving output signal Gout(n) at the turn-on level accordingly.

In the reset phase T3, the start signal STV is again set to the turn-off level and so is the Gout(n–1) signal. The Gout(n–1) signal is received at the turn-on level to turn M8 on to pull down the potential level at the pull-up node PU. The first bias-control terminal is provided with a turn-off level and the second bias-control terminal is provided with a turn-on level. Thus, M3 is turned on to pull up the pull-down node PD to the turn-on level.

In the subsequent reset-maintaining phase T4, the start signal STV is again set to a turn-off level and so are the Gout(n–1) and Gout(n+1) signals. The first bias-control terminal CLK1 and the second bias-control terminal CLK2 alternatively provide inverted-in-phase clock signals, e.g., CLK1 outputs a first clock signal CLK, CLK2 outputs a second clock signal CLKB, complementary to each other. The pull-up node PU is maintained at the turn-off level. The timing waveform of the potential level at the pull-down node PD is the same as the CLKB. Thus, the output terminal outputs the gate driving output signal Gout(n) at the turn-off level.

In all above time periods, from the input phase T1 through the reset-maintaining phase T4, the control level terminal CKV1 is provided with the turn-off level to turn the transistor M1 off.

In the reverse-bias phase T5, the control level terminal CKV1 is provided with the turn-on level to turn the transistor M1 on so that the potential level of the pull-down node PD is pulled down to the turn-off level VGL. Both the first bias-control terminal CLK1 and the second bias-control terminal CLK2 are provided with a turn-off level. The gate of M2 is at the turn-off level VGL and the source of M2 connected to CKV1 is at the turn-on level, making M2 in a reverse blocking state. The gate of M3 is at the turn-off level provided from CLK2. The source of M3 has a potential level provided by turn-off level VGL. At this time, if the potential level of CLK2 is set to be lower than the turn-off level VGL. M3 is set to be a reverse blocking state. The gate of M4 is at the turn-off level provided by CLK1 and the source of M4 is at the turn-on level CKV1, making M4 in a reverse blocking state. The gate of M5 is at the turn-off level provided by VGL and the source of M5 is at the turn-on level VKV1, making M5 in a reverse blocking state. Therefore, during the reverse-bias phase T5, transistors M2, M3, M4, and M5 are switched to a reverse bias condition so that the regular biasing tress across gate and source is reduced, thereby enhancing reliability of these transistors and the shift register, the gate driving circuit, and overall the display apparatus as well.

In the end phase T6, the shift reset terminal T_RST outputs a turn-on level, making the transistor M13 a conductor. The potential level of the pull-up node PU is pulled down to the turn-off level VGL. Now, the output terminal outputs the gate driving output signal Gout(n) at the turn-off level.

In some specific implementations of the method for driving the shift register of FIG. 6, during the reverse-bias phase T5, the Gout(n) signal at the output terminal may be caused into a floating state. In order to avoid the issue, a clock signal CLKB is introduced to the clock signal input terminal to drive the sixth transistor M6 to set the Gout(n) to the VGL alternatively in time so that output of the gate driving output signal Gout(n) can be stabilized.

In an alternative embodiment, the present invention provides a shift register unit comprising a first node-control module receiving a first input signal and a reset signal and being connected to a pull-up node. The shift register unit includes a second node-control module receiving the first input signal and a second input signal from the pull-up node and being connected to a pull-down node. Additionally, the shift register unit includes an output module connected to the pull-up node and an output terminal for outputting a gate driving output signal. The shift register unit also includes a first bias-control terminal, a second bias-control terminal, and a control level terminal. Furthermore, the shift register unit includes a first transistor having a gate connected to the control level terminal, a drain connected to the pull-down node, and a source provided with a turn-off level. The shift register unit further includes a second transistor having a gate connected to the pull-down node, a drain connected to the pull-up node, and a source connected to the control level terminal. The shift register unit further includes a third transistor having a gate and a drain commonly connected to the second bias-control terminal, and a source connected to the pull-down node. The shift register unit farther includes a fourth transistor having a gate connected to the first bias-control terminal, a drain connected to the pull-down node, and a source connected to the control level terminal. Furthermore, the shift register unit includes a fifth transistor having a gate connected to the pull-down node, a drain provided with the gate driving output signal, and a source connected to the control level terminal. The shift register unit is configured to be one of multiple units cascaded for forming a gate driving circuit for controlling image display in a plurality of operation cycles each including at least a reverse-bias phase.

In some embodiments, the shift register unit further includes a sixth transistor having a gate connected to an input terminal provided with a clock signal, a drain connected to the output terminal, and a source provided with the turn-off level. The sixth transistor is configured to provide the turn-off level alternatively in time following the clock signal from the source to the output terminal at the drain for stabilizing the gate driving output signal.

In some embodiments, the present disclosure provides a method for driving the shift register unit as described above. The method includes setting the control level terminal to the turn-on level to pull down the pull-down node to the turn-off level to make the gate of the second transistor, the third transistor, and the fifth transistor at the turn-off level and make the source of the second transistor, the fourth transistor, and the fifth transistor at the turn-on level. By doing so, the method is able to control both the second transistor and the fifth transistor at a reverse blocking state during the reverse-bias phase of each operation cycle. Additionally, the method includes setting the first bias-control terminal at the turn-off level to make the gate of the fourth transistor at the turn-off level and setting the second bias-control terminal at a level below the turn-off level to control both the third transistor and the fourth transistor at a reverse blocking state during the reverse-bias phase of each operation cycle. By setting these transistors to reverse blocking state, the severe gate-source biasing stress imposed regularly in their transistors can be substantially reduced. As a result, the stress-induced shift of threshold voltage level of these transistors are reduced, thereby enhancing the reliability of the transistors as key components in the shift register unit of a gate driving circuit for controlling image display.

In some embodiments, the present disclosure provides a method of driving a gate driving circuit that is implemented with a plurality of shift register units cascaded in series in each operation cycle for controlling image display. Each operation cycle includes a first display sub-cycle and a second display sub-cycle. The gate driving circuit is cascaded by a first N units of shift registers followed by a last M units of shift registers, where M and N are integers and a sum of M and N is a total number of shift registers cascaded for forming the gate driving circuit. Each shift register can be configured to one substantially the same as the shift register shown in FIG. 6.

The method of driving the gate driving circuit includes controlling the gate driving circuit to make reversed biases applying to all transistors in each of the second pull-up node control modules and each of the pull-down modules within last M units of the plurality of shift registers cascaded in the gate driving circuit during the first display sub-cycle. The method further includes controlling the gate driving circuit to make reversed biases applying to all transistors in each of the second pull-up node control modules and each of the pull-down modules within first N units of the plurality of shift registers cascaded in the gate driving circuit during the second display sub-cycle.

As each operation cycle is divided into the first display sub-cycle and the second display sub-cycle, the method of driving the gate driving circuit is, in the first display sub-cycle to control the first N units of shift registers to operate normally for outputting corresponding gate driving output signals and to control the last M units of shift registers such that all transistors in each of the second pull-up node control modules and each of the pull-down modules are set to a reverse blocking state for reducing threshold voltage shift of those transistors belonging to the last M units of shift registers. In the next second display sub-cycle, the method is to control the last M units of shift registers to operate normally for outputting corresponding gate driving output signals and to control the first N units of shift registers such that all transistors in each of the second pull-up node control modules and each of the pull-down modules are set to a reverse blocking state for reducing threshold voltage shift of those transistors belonging to the first N units of shift registers. Therefore, within a complete time period of each operation cycle, the stress-induced threshold voltage shift of all corresponding transistors in all shift registers due to long working hours can be reduced.

Figure 8:
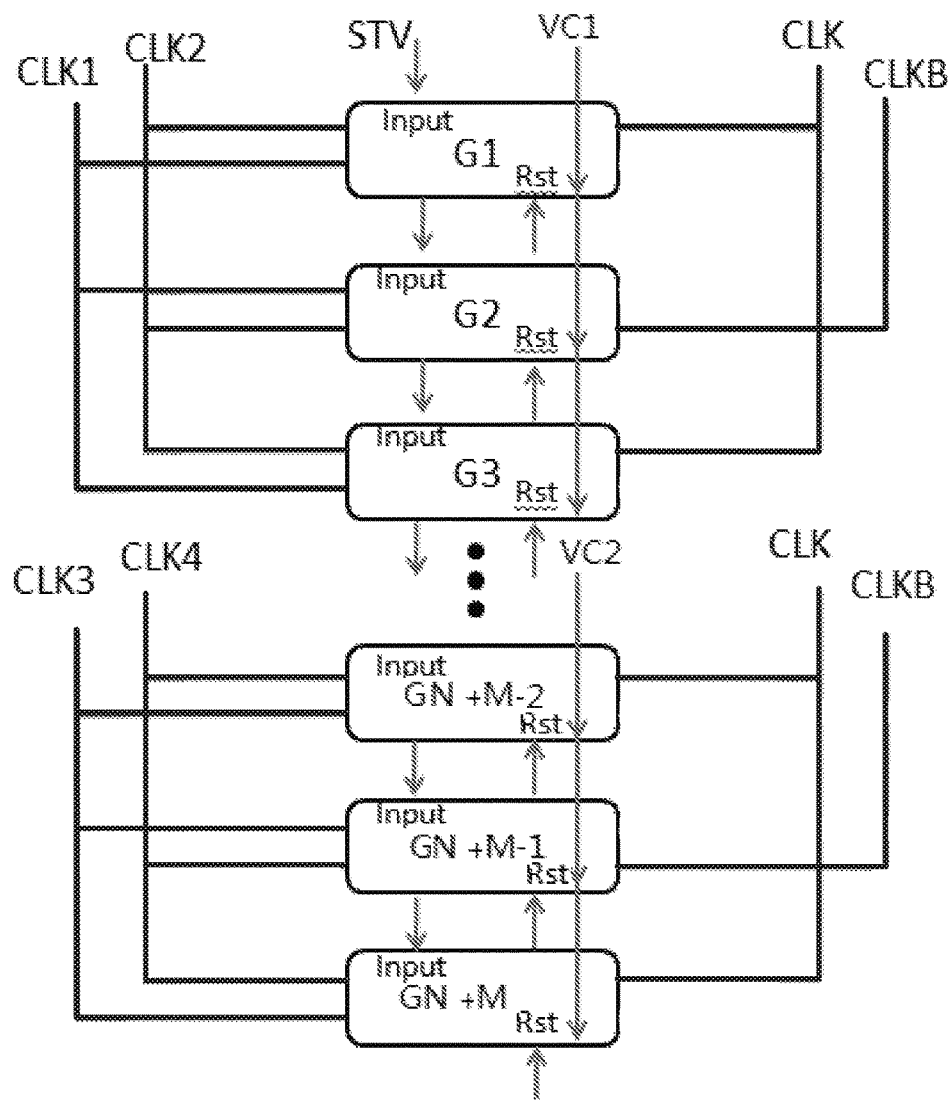
FIG. 8 is a simplified block diagram of a gate driving circuit formed by cascading multiple shift register units in some embodiments.

FIG. 8 is a simplified block diagram of a gate driving circuit formed by cascading multiple shift register units in some embodiments. Referring to FIG. 8, the gate driving circuit includes multiple, N+M, shift register units cascaded in series, where N and M are natural integers. Each of the first N shift register units, from G1 through GN, includes a first bias-control terminal and a second bias-control terminal, and a first control level terminal provided with a first control voltage VC1. For each odd numbered shift register unit in the first N units, the first bias-control terminal is provided with a first bias signal CLK1 and the second bias-control terminal is provided with a second bias signal CLK2. For each even numbered shift register unit in the first N units, the first bias-control terminal is switched to the second bias signal CLK2 and the second bias-control terminal is switched to the first bias signal CLK1. Each of the last M shift register units, from GN+1 to GN+M, includes a third bias-control terminal and a fourth bias-control terminal, and a second control level terminal provided with a second control voltage VC2. For each odd numbered shift register unit in the last M units, the third bias-control terminal is provided with a third bias signal CLK3 and the fourth bias-control terminal is provided with a fourth bias signal CLK4. For each even numbered shift register unit in the last M units, the third bias-control terminal is switched to the fourth bias signal CLK4 and the fourth bias-control terminal is switched to the third bias signal CLK3. M+N equals to a total number of the cascaded multiple shift register units in the gate driving circuit. The GN unit is cascaded in series with the GN+1 unit.

Referring to FIG. 8, G2 represents the second shift register unit, G3 represents the third shift register unit, GN+M−2 represents the (N+M−2)th shift register unit, GN+M−1 represents the (N+M−1)th shift register unit. Except the first shift register unit 61, every shift register unit includes an input terminal connected to an output terminal with a gate driving output signal from a last adjacent shift register unit. Except the last shift register unit GN+M, every shift register unit includes a reset terminal connected to an output terminal with a gate driving output signal from a next adjacent shift register unit. The first shift register unit G1 has an input terminal receiving a start signal STV. The last shift register unit GN+M includes a reset terminal receiving a reset signal RST. In some embodiments, every shift register unit includes a start terminal receiving the start signal STV and a shift reset terminal receiving the reset signal RST.

In some embodiments, each shift register unit includes a clock input terminal and every two adjacent shift register units respectively receive two clock signals that have inverting phase complementary to each other. For example, the first shift register unit G1 receives a clock signal CLK, for example, at high voltage level, then the second shift register unit G2 receives a clock signal CLKB at low voltage level, the phase of CLK is inverted from the phase of CLKB, and so forth. The inverting CLK/CLKB is introduced to solve a problem of existence of a floating state when both the first bias signal CLK1 and the second bias signal CLK2 in the first N shift register units or both the third bias signal CLK3 and the fourth bias signal CLK4 in the last M shift register units are set to the turn-off level. With clock signal CLKB complementary to CLK, the gate driving output signal from each shift register unit can be maintained stable. In particular as shown in the shift register of FIG. 6, transistor M6 is included for introducing the CLKB or CLK signal for maintaining stability of the gate driving output signal.

Figure 9:
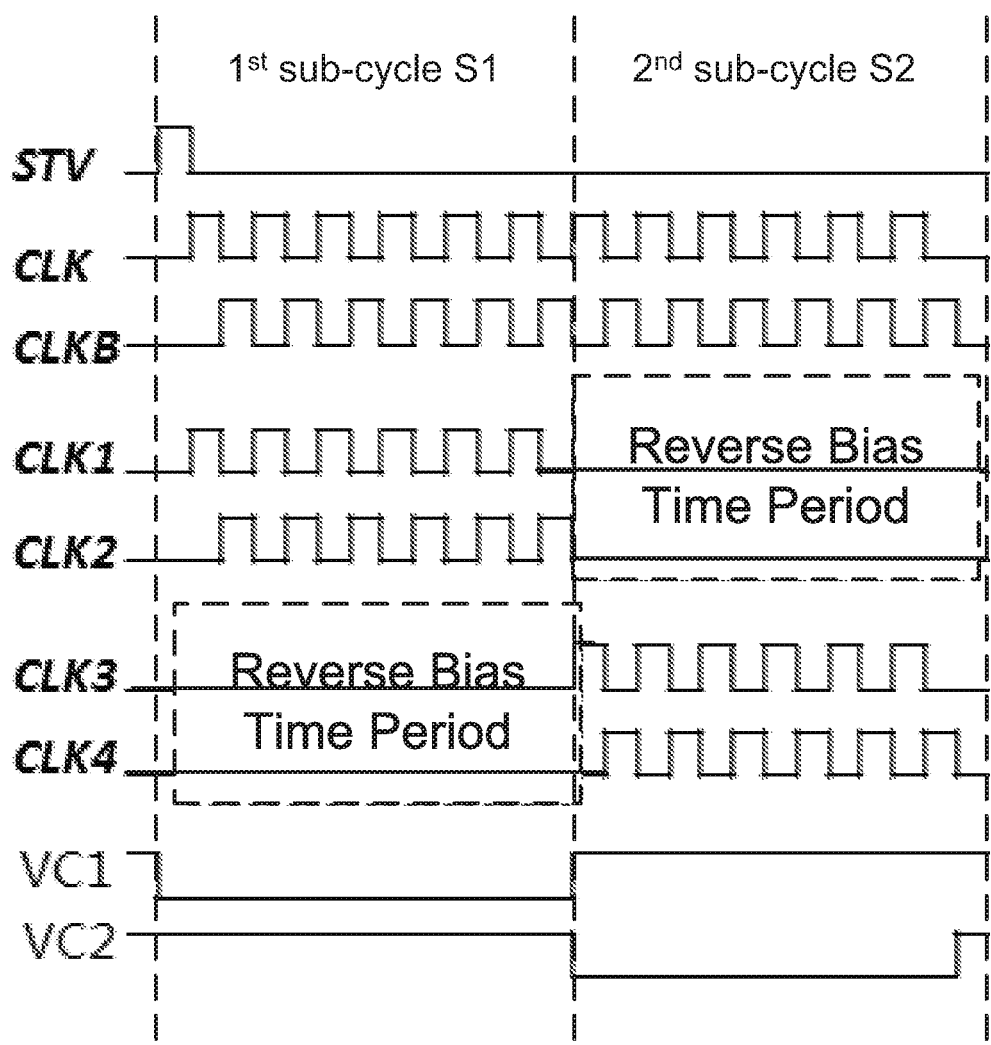
FIG. 9 is an operation timing diagram for the gate driving circuit of FIG. 8 in some embodiments.

FIG. 9 is an operation timing diagram for the gate driving circuit of FIG. 8 in some embodiments. Referring to FIG. 9, an operation cycle of driving the gate driving circuit of FIG. 8 for controlling image display is divided into a $1^{st}$ sub-cycle and a $2^{nd}$ sub-cycle. In the $1^{st}$ sub-cycle, the first bias signal CLK1 and the second bias signal CLK2 are two clock signals at respective turn-on level and turn-off level with inverted phase complementary to each other. The first control voltage VC1 is set to a turn-off level so that the first N shift register units are controlled to operate normally to output each corresponding gate driving output signal. Within the same time period of the $1^{st}$ sub-cycle, the third bias signal CLK3 and the fourth bias signal CLK4 are set to a turn-off level and the second control level VC2 is set to the turn-on level. Then each of the last M shift register units is controlled to make all the transistors within the second pull-up node control module and pull-down module thereof to be set in a reverse blocking state. Simply, the last M shift register units are set to output gate driving output signal at (low voltage) turn-off level.

In the $2^{nd}$ sub-cycle, the first bias signal CLK1 and the second bias signal CLK2 are set to the turn-off level and the first control level VC1 is set to the turn-on level. Then the first N shift register units are controlled to make all the transistors within each of the second pull-up node control modules and each pull-down modules thereof to be set at a reverse blocking state. Simply, the first N shift register units are set to a reverse bias phase. Within the same time period of the $2^{nd}$ sub-cycle, the third bias signal CLK3 and the fourth bias signal CLK4 are two clock signals with inverted phase complementary to each other. The second control voltage VC2 is set to the turn-off level so that the last M shift register units are controlled to operate normally to output each corresponding gate driving output signal.

In some embodiments, M is equal to N and the time period associated with the $1^{st}$ sub-cycle is equal to the time period associated with the $2^{nd}$ sub-cycle. In such a scheme, the working hour of the transistors in every shift register unit is equal to the time of being partially set in a reverse blocking state, thereby reducing the stress-induced threshold voltage shift for all transistors in the gate driving circuit can be optimized.

A specific example is shown below in FIG. 10 to illustrate a gate driving circuit having total number of 320 cascaded shift register units in some embodiments. In the example, a whole display panel includes a gate driving circuit having 320 rows of shift register units to provide control of corresponding gate driving signals. The gate driving circuit is configured to use at least a first bias signal CLK1, a second bias signal CLK2, and a first control voltage VC1 to drive all first 160 shift register units, G1-G160. The gate driving circuit also is configured to use a third bias signal CLK3, a fourth bias signal CLK4, and a second control level VC2 to drive all last 160 shift register units, G161-G320.

Figure 10:
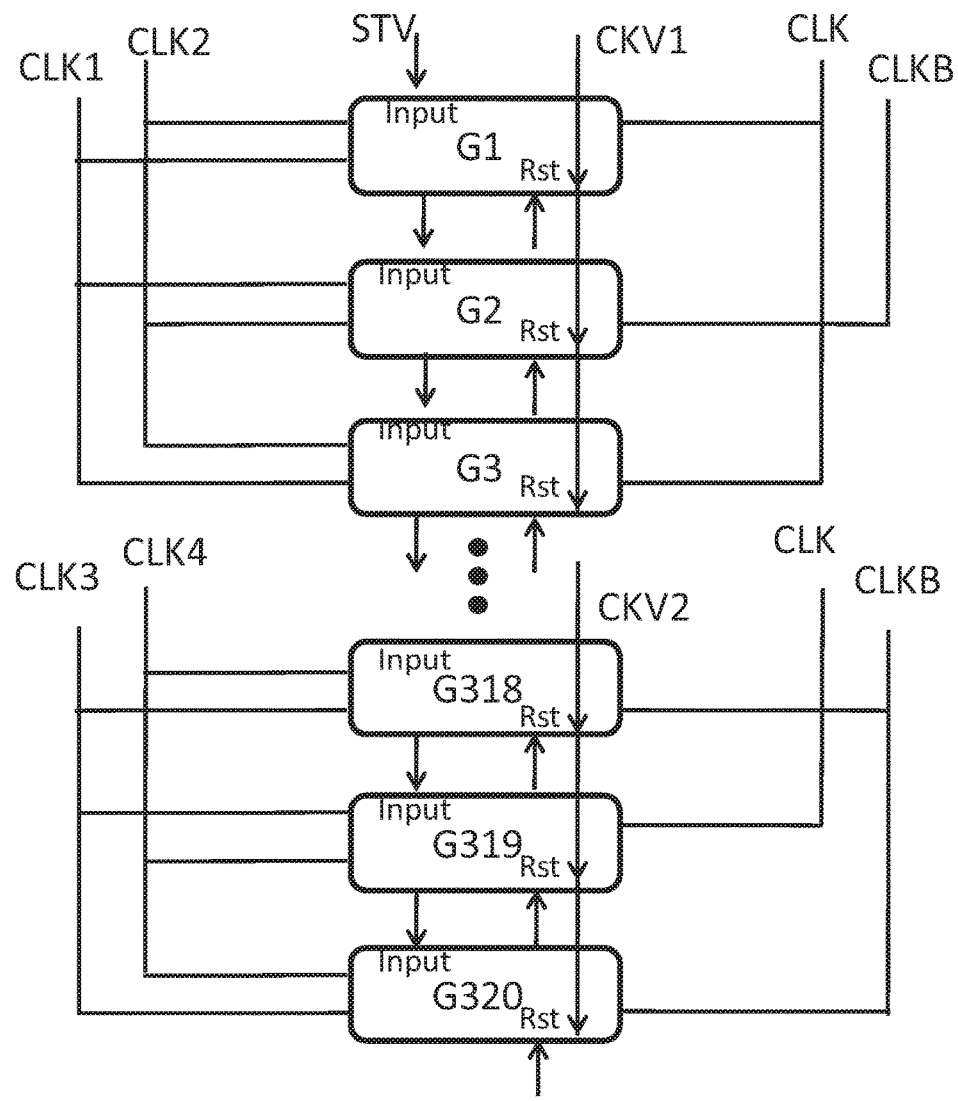
FIG. 10 is a simplified block diagram of a gate driving circuit in some embodiments.

Referring to FIG. 10, for all odd numbered units of the first 160 shift register units, a first bias control terminal is provided with the first bias signal CLK1, a second bias control terminal is provided with the second bias signal CLK2, a first control level terminal is provided with the first control voltage VC1; for all even numbered units of the same 160 shift register units, the first bias control terminal is switched to the second bias signal CLK2, the second bias control terminal is switched to the first bias signal CLK1, the first control level terminal is still provided with the first control voltage VC1. The first shift register unit G1 has an input terminal receiving a start signal STV. Other than the first unit, every shift register unit in the first 160 shift register units has an input terminal receiving a gate driving output signal from an output terminal of the previous adjacent shift register unit. For the last 160 shift register units, a third bias control terminal is provided with the third bias signal CLK3, a fourth bias control terminal is provided with the fourth bias signal CLK4, and a second control level terminal is provided with a second control level VC2. Except the last shift register unit G320, every shift register unit in the last 160 shift register units has a reset terminal receiving a gate driving output signal from an output terminal of the next adjacent shift register unit.

Referring to FIG. 10 again, G2 represents the second shift register unit. G3 represents the third shift register unit. G318 represents the $318^{th}$ shift register unit. G319 represents the $319^{th}$ shift register unit. In an embodiment, every shift register unit is the same as the shift register unit shown in FIG. 6.

Referring to FIG. 10 again, the gate driving circuit is driven in a plurality of operation cycles for controlling a display panel for image display. Each operation cycle includes a first sub-cycle S1 and a second sub-cycle S1 in the first sub-cycle S1, which is a first working time period for each of the first 160 shift register units from G1 to G160. Each time, the cycled operation is started by introducing a STV signal to a first shift register unit of the gate driving circuit associated with the display panel. In particular, the STV signal is connected to the input terminal of unit G1. G1, while receiving another gate driving output signal from the next adjacent shift register unit as a reset signal, outputs a (first) gate driving signal which is used as an input into unit G2, and so forth, until it ends with unit G160 outputting a gate driving signal at the turn-on level. The first bias signal CLK1 and the second bias signal CLK2 are, during the S1, provided with a pair of complementary clock signals with inverted phase to ensure that G1-G160 are operated normally to output corresponding gate driving signals. During the first sub-cycle S1, in each of the last 160 shift register units, G161-G320, the third bias signal CLK3 and the fourth bias signal CLK4 are provided with the turn-off level and the second control level is provided with VC2 at the turn-on level. In some embodiments, a first transistor M1 associated with the pull-down module of each shift register unit is turned on to pull down potential level of the pull-down node PD. As a result, other transistors M2, M3, M4, and M5 in the second pull-up node control module are set to a reverse block state, thereby reducing stress-induced threshold voltage drift thereof.

In the second sub-cycle S2, which is a working time period for the last 160 shift register units from G161 to G320, G161 starts output a gate driving signal to the adjacent next shift register unit, and so forth until it ends with G320 normally outputting a gate driving output signal at a turn-on level. The third bias signal CLK3 and the fourth bias signal CLK4, during the second sub-cycle S2, are provided with a second pair of complementary clock signals with inverted phase to ensure that G161-G320 shift register units are working normally to output corresponding gate driving signals. During the second sub-cycle S2, in the first 160 shift register units, G1-G160, CLK1 and CLK2 are receiving a turn-off level and the first control voltage VC1 is provided with a turn-on level so that the first transistor M1 is turned on for each shift register unit to pull down the pull-down node PD thereof. As a result, all transistors M2, M3, M4, and M5 is each of the first 160 shift register units are set to a reverse blocking state, thereby reducing stress-induced threshold voltage drift thereof.

In some embodiments, when CLK1, CLK2 or CLK3, CLK4 are set to a turn-off level during a reverse-bias phase, the corresponding gate driving output signal may be in a floating state. When these clock signals are provided with complementary CLK and CLKB with inverted phase controlled by a transistor M6, outputting the gate driving signal from each shift register would be stabilized.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of driving a gate driving circuit in an operation cycle divided into a first sub-cycle and a second sub-cycle, the method comprising:
    providing a gate driving circuit having a first plurality of shift register units with a second plurality of shift register units, the first plurality of shift register units being configured so that each odd/even numbered shift register unit includes a first bias-control terminal to receive a first/second bias signal CLK1/CLK2, a second bias-control terminal to receive a second/first bias signal CLK2/CLK1, and a first control level terminal provided with a first control voltage VC1, the second plurality of shift register units being configured so that each odd/even numbered shift register unit includes a third bias-control terminal to receive a third/fourth bias signal CLK3/CLK4, a fourth bias-control terminal to receive a fourth/third bias signal CLK4/CLK3, and a second control level terminal provided with a second control voltage VC2;
    configuring the first bias signal CLK1 and the second bias signal CLK2 as first pair of clock signals at respective turn-on level and turn-off level with inverted phase in the first sub-cycle;
    setting the first control voltage VC1 to a turn-off level so that the first plurality of shift register units is controlled along with the first pair of clock signals to respectively output corresponding gate driving output signals in an output phase within the first sub-cycle;
    setting both the third bias signal CLK3 and the fourth bias signal CLK4 to a turn-off level and the second control voltage VC2 to turn-on level during the first sub-cycle;
    configuring the third bias signal CLK3 and the fourth bias signal CLK4 as second pair of clock signals at respective turn-on level and turn-off level with inverted phase in the second sub-cycle;
    setting the second control voltage VC2 to a turn-off level so that the second plurality of shift register units are controlled along with the second pair of clock signals to respectively output corresponding gate driving output signals in an output phase within the second sub-cycle; and
    setting the first bias signal CLK1 and the second bias signal CLK2 to a turn-off level and the second control voltage VC1 to a turn-on level during the second sub-cycle.

2. The method of claim 1, wherein the first plurality of shift register units comprises N shift register units cascaded in series from a first unit to Nth unit, N being a natural integer;
    the second plurality of shift register units comprises M shift register units cascaded in series from (N+1)th unit to (N+M)th unit, M being a natural integer; the Nth unit being cascaded in series with the (N+1)th unit; and
    M equals to N.

3. The method of claim 2, wherein the first sub-cycle and the second sub-cycle comprise two equal time periods, each of the first sub-cycle and the second sub-cycle comprises an input phase, an output phase, a reset phase, and a reset-maintaining phase, the second/first sub-cycle is a reverse-bias phase associated with the first/second sub-cycle.

4. The method of claim 3, further comprising applying a third pair of clock signals with respective turn-on level and turn-off level at inverted phase to an output control terminal of respective odd and even numbered shift register units during both the first sub-cycle and the second sub-cycle.

5. The method of claim 2, wherein each shift register unit have a same circuit configuration as a (n)th unit, where n is a natural integer serial number of one of the first plurality of shift register units and the second plurality of shift register units, the (n)th unit comprising:
    a first pull-up node control module having an input terminal and a reset terminal and being coupled to a pull-up node, the input terminal receiving a (n−1)th gate driving output signal from an adjacent (n−1)th unit for pulling up the pull-up node to a turn-on level during the input phase and bootstrapping the pull-up node above the turn-on level during the output phase, the reset terminal receiving a (n+1)th gate driving output signal from an adjacent (n+1)th unit for pulling down the pull-up node back to a turn-off level during the reset phase;
    an output module coupled to the pull-up node and having an output terminal for outputting (n)th gate driving output signal at a turn-on level based on bootstrapping the pull-up node above the turn-on level during the output phase;
    a first pull-down node control module coupled to the pull-up node and a pull-down node and receiving the (n−1)th gate driving output signal from the first input terminal for pulling down the pull-down node to a turn-on level during the input phase when the pull-up node is at a turn-on level;
    a second pull-up node control module coupled between the pull-up node and the pull-down node for pulling down the pull-up node to a turn-off level when the pull-down node is at a turn-on level;
    a pull-down module coupled between the pull-down node and the output terminal for controlling the (n)th gate driving output signal at a turn-on level during the reset phase by controlling the pull-down node to a turn-on level, and keeping the (n)th gate driving output signal at a turn-off level during a reset-maintaining phase; and a reverse-bias control module coupled to both the second pull-up node control module and the pull-down module.

6. The method of claim 5, wherein the reverse-bias control module comprises a first transistor having a source provided with a turn-off level, a drain coupled to the pull-down node, and a gate connected to the first/second control level terminal provided with the first/second control voltage VC1/VC2 if the reverse-bias control module belongs to one of the first/second plurality of shift register units.

7. The method of claim 5, wherein the second pull-up node control module comprises a second transistor having a gate connected to the pull-down node, a drain connected to the pull-up node, and a source connected to the first/second control level terminal provided with the first/second control voltage VC1/VC2 if the second pull-up node control module belongs to one of the first/second plurality of shift register units.

8. The method of claim 5, wherein the (n)th unit is an odd/even numbered shift register unit of the first plurality of shift register units, the pull-down module thereof comprises:
a third transistor having a drain connected to the pull-down node, a gate and a source commonly connected to the second/first bias-control terminal provided with the second/first bias signal CLK2/CLK1; and
a fourth transistor having a gate connected to the first/second bias-control terminal provided with the first/second bias signal CLK1/CLK2, a drain connected to the pull-down node, and a source connected to the first control level terminal; and a fifth transistor having a gate connected to the pull-down node, a drain connected to the output terminal provided with the (n)th gate driving output signal, and a source connected to the first control level terminal provided with the first control voltage VC1.

9. The method of claim 5, wherein the (n)th unit is an odd/even numbered shift register unit of the second plurality of shift register units, the pull-down module thereof comprises:
a third transistor having a drain connected to the pull-down node, a gate and a source commonly connected to the fourth/third bias-control terminal provided with the fourth/third bias signal CLK4/CLK3;
a fourth transistor having a gate connected to the third/fourth bias-control terminal provided with the third/fourth bias signal CLK3/CLK4, a drain connected to the pull-down node, and a source connected to the second control level terminal provided with the second control voltage VC2; and
a fifth transistor having a gate connected to the pull-down node, a drain connected to the output terminal provided with the (n)th gate driving output signal, and a source connected to the second control level terminal provided with the second control voltage VC2.

10. The method of claim 5, further comprising using an output control module in the (n)th unit of the first/second plurality of shift register units to control outputting the (n)th gate driving output signal at a turn-off level during the second/first sub-cycle, wherein the output control module comprises a sixth transistor having a gate provided with to a clock signal, a drain connected to the output terminal, and a source provided with a turn-off level.

11. The method of claim 5, wherein the first pull-up node-control module comprises:
a seventh transistor having a gate and a source commonly connected to the input terminal, and a drain connected to the pull-up node;

an eighth transistor having a gate connected to the reset terminal, a drain connected to the pull-up node, and a source provided with a turn-off level; and
a storage capacitor having a first terminal connected to the pull-up node and a second terminal connected to the output terminal.

12. The method of claim 5, wherein the (n)th unit is an odd/even numbered shift register unit of the first plurality of shift register units, the output module thereof comprises a ninth transistor having a gate connected to the pull-up node, a source connected to the first/second bias-control terminal provided with the first/second bias signal CLK1/CLK2, and a drain connected to the output terminal.

13. The method of claim 5, wherein the (n)th unit is an odd/even numbered shift register unit of the second plurality of shift register units, the output module thereof comprises a ninth transistor having a gate connected to the pull-up node, a source connected to the third/fourth bias-control terminal provided with the third/fourth bias signal CLK3/CLK4, and a drain connected to the output terminal.

14. The method of claim 5, wherein the first pull-down node-control module comprises:
a tenth transistor having a gate connected to the pull-up node, a drain connected to the pull-down node, and a source provided with a turn-off level; and
an eleventh transistor having a gate controlled by the (n−1)th gate driving output signal from the adjacent (n−1)th unit, a drain connected to the pull-down node, and a source provided with a turn-off level.

15. The method of claim 5, further comprising:
a starting module connected to a start terminal and the pull-down node, the start terminal being provided with a starting signal at a turn-on level for controlling the pull-down node at a turn-on level;
a shift reset module connected to a shift reset terminal and the pull-up node, the shift reset terminal being provided with a shift reset signal at a turn-on level for controlling the pull-up node at a turn-off level; and
an output pull-down module for controlling the output terminal with the (n)th gate driving output signal at a turn-off level when the (n+1)th gate driving output signal is provided with a turn-on level at the reset terminal.

16. The method of claim 15, wherein the starting module comprises a twelfth transistor having a gate and a source commonly provided with the starting signal and a drain connected to the pull-down node;
the shift reset module comprises a thirteenth transistor having a gate controlled by the shift reset signal, a drain connected to the pull-up node, and a source provided with a turn-off level; and
the output pull-down module comprises a fourteenth transistor having a gate connected to the reset terminal provided with the (n+1)th gate driving output signal, a drain connected to the output terminal for outputting the (n)th gate driving output signal, and a source provided with a turn-off level.

17. The method of claim 15, wherein the (n)th unit is a first unit of the first plurality of shift register units, the first pull-up node control module thereof comprises an input terminal to receive the starting signal for pulling up the pull-up node to a turn-on level during the input phase and bootstrapping the pull-up node above the turn-on level during the output phase.

18. The method of claim 15, wherein the (n)th unit is a last unit of the second plurality of shift register units, the first pull-up node control module thereof comprises a reset terminal to receive the shift reset signal for pulling down the pull-up node back to a turn-off level during the reset phase.

19. The method of claim 5, wherein the reverse-bias control module of each of the first/second plurality of shift register units is used to set a reverse bias blocking state to each transistor in the second pull-up node control module and pull-down module thereof during the second/first sub-cycle.

20. A gate driving circuit, comprising a first plurality of shift register units cascaded in series and a second plurality of shift register units cascaded in series, each of the second plurality of shift register units except a last shift register unit has an output terminal outputting a gate driving output signal which is used as an input signal at an input terminal of a next adjacent shift register unit, and each of the first plurality of shift register units except a first shift register has an output terminal outputting a gate driving output signal which is used as a reset signal at a reset terminal of a previous adjacent shift register unit;

wherein the first plurality of shift register units being configured so that each odd/even numbered shift register unit includes a first bias-control terminal to receive a first/second bias signal, a second bias-control terminal to receive a second/first bias signal, and a first control level terminal provided with a first control voltage, the second plurality of shift register units being configured so that each odd/even numbered shift register unit includes a third bias-control terminal to receive a third/fourth bias signal, a fourth bias-control terminal to receive a fourth/third bias signal, and a second control level terminal provided with a second control voltage level; and the first plurality of shift register units is configured to output respective gate driving output signals during a first sub-cycle while the second plurality of shift register units is partially configured to be in a reverse-bias state, and the first plurality of shift register units is partially configured to be in a reverse-bias state during a second sub-cycle while the second plurality of shift register units is configured t to output respective gate driving output signals, wherein the second sub-cycle sequentially follows the first sub-cycle plus to be one complete operation cycle.

* * * * *